(12) United States Patent
Haas et al.

(10) Patent No.: US 8,508,227 B2
(45) Date of Patent: Aug. 13, 2013

(54) METHOD FOR POSITION DEPENDENT CHANGE IN THE MAGNETIZATION IN AN OBJECT IN A MAGNETIC RESONANCE EXPERIMENT

(75) Inventors: Martin Haas, Freiburg (DE); Peter Ullmann, Karlsruhe (DE); Wolfgang Ruhm, Ettlingen (DE); Maxim Zaitsev, Freiburg (DE); Jürgen Hennig, Freiburg (DE)

(73) Assignees: Bruker BioSpin MRI GmbH, Ettlingen (DE); Universitaetsklinikum Freiburg, Freiburg (DE)

( * ) Notice: Subject to any disclaimer, the term of this patent is extended or adjusted under 35 U.S.C. 154(b) by 421 days.

(21) Appl. No.: 12/897,806

(22) Filed: Oct. 5, 2010

(65) Prior Publication Data

US 2011/0080169 A1    Apr. 7, 2011

(30) Foreign Application Priority Data

Oct. 7, 2009  (DE) .......................... 10 2009 045 464

(51) Int. Cl.
*G01V 3/00* (2006.01)
(52) U.S. Cl.
USPC .......................................... 324/314; 324/307
(58) Field of Classification Search
USPC ................... 324/314, 307, 309, 318
See application file for complete search history.

(56) References Cited

U.S. PATENT DOCUMENTS

| | | | |
|---|---|---|---|
| 5,258,711 A | 11/1993 | Hardy | |
| 5,506,504 A | 4/1996 | Von Kienlin | |
| 5,564,421 A | 10/1996 | Ehnholm | |
| 7,075,302 B2 * | 7/2006 | Zhu | 324/318 |
| 7,208,949 B2 | 4/2007 | Fuderer | |
| 7,218,113 B2 * | 5/2007 | Feiweier et al. | 324/320 |
| 7,411,395 B2 | 8/2008 | Hennig | |

(Continued)

FOREIGN PATENT DOCUMENTS

DE    196 16 388    11/1997

OTHER PUBLICATIONS

A.M. Welz et al., "Initial realisation of a multichannel, non-linear PatLoc gradient coil", Proc.Intl.Soc.Magn.Reson.Med. 16(2008).

(Continued)

*Primary Examiner* — Louis Arana
(74) *Attorney, Agent, or Firm* — Paul Vincent

(57) ABSTRACT

A method for position dependent change in the magnetization in an object, according to a requirement in a magnetic resonance measurement, wherein radio-frequency pulses are irradiated in conjunction with supplementary magnetic fields that vary in space and over time and are superposed on the static and homogeneous basic field of a magnetic resonance measurement apparatus along a z-direction, is characterized in that non-linear supplementary magnetic fields are used, whose spatial gradient of the z-component is not constant at least at one instant of the irradiation, and that the radio-frequency pulses to be irradiated are calculated in advance, wherein progressions over time of the field strengths of the supplementary magnetic fields in the region of the object that are calculated and/or measured position-dependently are included in this calculation. This enables change in the magnetization with an at least locally spatially higher resolution and/or shorter irradiation duration of the RF pulses and supplementary magnetic fields than is feasible with linear supplementary magnetic fields produced by conventional gradient systems. In particular, this is possible under the technical and physiological conditions that currently constrain the performance of the known methods using linear supplementary fields.

8 Claims, 12 Drawing Sheets

(56) References Cited

U.S. PATENT DOCUMENTS

| | | | | |
|---|---|---|---|---|
| 7,843,195 | B2* | 11/2010 | Ruhm | 324/309 |
| 8,049,497 | B2* | 11/2011 | Katscher et al. | 324/309 |
| 2004/0160221 | A1 | 8/2004 | Kiefer | |

OTHER PUBLICATIONS

Dan Xu et al., "Designing Multichannel, Multidimensional, Arbitrary Flip Angle RF Pulses Using an Optimal Control Approach", Magnetic Resonance in Medicine 59:547-560 (2008).

Ed X. Wu et al., "A New 3D Localization Technique Using Quadratic Field Gradients", MRM 32:242-245 (1994).

William Grissom et al., "Spatial Domain Method for the Design of RF Pulses in Multicoil Parallel Excitation", Magnetic Resonance in Medicine 56:620-629 (2006).

Andrew J.M. Kiruluta "The emergence of the propagation wave vector in high field NMR: analysis and implications", J. Phys. D: Appl. Phys. 40 (2007) 3043-3050.

David O. Brunner, Nicola De Zanche, Juerg Froehlich, Jan Paska + Klaas P. Pruessmann "Travelling-wave nuclear magnetic resonance", Nature, vol. 457/19 Feb. 2009, p. 994 ff.

Ulrich Katscher, Peter Boernert, Christoph Leussler, + Johan S. Van Den Brink "Transmit Sense" Magnetic Resonance in Medicine 49:144-150 (2003).

Klaus P. Pruessmann, Markus Weiger, Markus B. Scheidegger + Peter Boesiger "Sense: Sensitivity Encoding for Fast MRI", Magnetic Resonance in Medicine 42:952-962 (1999).

John Pauly, Dwight Nishimura + Albert Macovski "A k-Space Analysis of Small-Tip-Angle Excitation", Magnetic Resonance 81 (1989) 43-56.

Dan Xu, Kevin F. King, Yudong Zhu, Graeme C. Mckinnon + Zhi-Pei Liang "Designing Multichannel, Multidimensional, Arbitrary Flip Angle RF Pulses Using an Optimal Control Approach", Magnetic Resonance in Medicine 59:547-560 (2008).

* cited by examiner

METHOD FOR POSITION DEPENDENT CHANGE IN THE MAGNETIZATION IN AN OBJECT IN A MAGNETIC RESONANCE EXPERIMENT

This application claims Paris Convention priority of DE 10 2009 045 464.0 filed Oct. 7, 2009 the complete disclosure of which is hereby incorporated by reference.

BACKGROUND OF THE INVENTION

The invention relates to a method for position dependent change in the magnetization in an object, according to a requirement, in a magnetic resonance experiment, wherein radio-frequency pulses are irradiated in conjunction with supplementary magnetic fields varying in space and over time that are superposed on the static and homogeneous basic field of a magnetic resonance measurement apparatus along a z-direction.

Such a method is known, for example, from Xu, D., King, K. F., Zhu, Y., McKinnon, G. C., Liang, Z. P.: *Designing Multichannel, Multidimensional, Arbitrary Flip Angle RF Pulses Using an Optimal Control Approach*, Magnetic Resonance in Medicine 59 (2008), 547-560.

Magnetic resonance imaging (MRI), also termed magnet resonance tomography (MRT), is a widespread technique for non-invasive acquisition of images of the interior of an object under examination based on the spatially resolved measurement of magnetic resonance signals from the object under examination. By exposing the object under examination to an essentially static and homogeneous magnetic basic field (also termed main magnetic field) within an examination volume of a magnetic resonance apparatus, nuclear spins contained in the object are aligned with the basic field, usually as the z-direction of a magnet-related coordinate system. The associated alignment of the magnetic dipole moments of the atomic nuclei results in magnetization within the object in the direction of the main magnetic field. This magnetization is referred to as longitudinal magnetization. In an MR examination (MR: magnetic resonance), a precessing motion of this magnetization is excited within the object under examination by irradiation of RF electromagnetic pulses (RF: radio frequency), whose frequency is proportional to the local magnetic field strength, by means of one or more RF transmission antennas. The vector of the magnetization is deflected from the equilibrium orientation (z-direction) through an angle hereinafter referred to as the flip angle.

In the MRI methods in general use today, spatial encoding is imposed on the precession movements of the nuclear spins for all three spatial directions by time-variable superposition of additional position-dependent magnetic fields, hereinafter referred to as supplementary magnetic fields. These supplementary magnetic fields usually exhibit essentially constant gradients of the z-component in the spatial directions x, y and z within the object under examination and are produced by a coil configuration, termed a gradient system, that is controlled by one gradient channel for each spatial direction. Where magnetic fields are described hereinafter as linear or non-linear, this refers, unless stated otherwise, to the spatial dependence of the z-component of the fields. The spatial encoding is usually described in a space, called k-space, that is conjugated to real space by means of a Fourier transformation. In this k-space formalism, which can only be applied to the use of magnetic fields with gradients that are constant in space, it is possible to describe the switching of supplementary magnetic field pulses as a progression along a trajectory in k-space, termed the k-space trajectory.

The transverse component of the precessing magnetization associated with the nuclear spins, hereinafter also referred to as the transverse magnetization, induces electrical voltage signals, which are also known as magnetic resonance signals (MR signals), in one or more RF reception antennas surrounding the object under examination. By means of pulse sequences that contain specially selected sequences of RF pulses and supplementary magnetic field pulses (brief application of supplementary magnetic fields that are constant or variable over time), time-variable magnetic resonance signals are produced in such a way that they can be converted to the corresponding spatial representations. This is done according to one of many well-known reconstruction methods after the MR signals have been acquired, amplified, and digitized using an electronic receiver system, processed using an electronic computer system, and stored in one-dimensional or mufti-dimensional data sets. The pulse sequence used typically contains a sequence of measurement operations (termed phase-encoding steps) in which the gradient pulses can be varied according to the chosen spatial encoding method.

The position dependent change in the magnetization, hereinafter abbreviated to SDMM (SDMM: spatially dependent modification of magnetization), is a widespread technique in magnetic resonance imaging that is used to convert magnetization that is present at one instant in an object under examination into new magnetization position-dependently by irradiating RF pulses in conjunction with supplementary magnetic fields that vary in space and over time. This means that, for each position within the object under examination, the magnetization present at that position is specifically modified or put into a condition that is defined specifically for this position. One example of this is the spatially selective excitation that is used to produce transverse magnetization within a specific space in an excitation volume and/or to vary its amplitude and phase spatially in accordance with defined distributions.

In slice selection, the most frequent case of spatially selective excitation, the excitation volume is reduced to a defined slice. The multi-dimensional, spatially selective excitation in which the excitation volume is restricted in more than one direction and/or the excitation is modulated in more than one direction, has also yielded numerous applications. These include excitation of a small three-dimensional volume within a much larger object under examination for localized spectroscopy, the mapping of a selectively excited region (ROI: region of interest) with a reduced field of view (FOV) with the aim of reducing the measurement time or improving resolution, the excitation of special volumes adapted to structures of the object under examination, or echo-planar imaging with reduced echo train lengths.

The amplitude and phase modulation of the transverse magnetization in the excitation can also be used to compensate for disadvantageous effects of a non-homogeneous magnetic transmission field ($B_1$ field) of the RF transmission antennas used for excitation. This is an application that has become considerably more important today due to the large increase in high field MRI systems on which such non-homogeneities especially occur. In addition to its use for excitation, the SDMM can also be used for spatially selective inversion or refocusing of the magnetization.

A further interesting application of SDMM is targeted production of a phase distribution of the transverse magnetization during excitation. In the method described in Yip, C., Fessler, J. A., Noll, D. C.: *Advanced Three-Dimensional Tailored RF Pulses for Signal Recovery in $T^*_2$-Weighted Functional Magnetic Resonance*, Magnetic Resonance in Medicine 56 (2006), 1050-2059, a spatial phase pattern of the transverse magnetization of the nuclear spins is produced during excitation using three-dimensional selective excitation. This method at least partially compensates for dephasing of the MR signal due to susceptibility during the imaging experiment and thus reduces signal losses. This is achieved by calculating in advance the phase pattern used for phase compensation, that is, a spatial phase distribution of the transverse magnetization.

In the method disclosed in DE 10 2007 044 463 B4, such generation of phase patterns of the transverse magnetization during excitation is used to achieve partial or complete spatial encoding of the magnetic resonance signals during excitation. By repeated excitation with different phase patterns defined according to a phase encoding scheme and subsequent data acquisition on each repeat, a total data set is obtained from multiple phase encoding steps that is then reconstructed having been resolved spatially according to the spatial encoding scheme and provides, for example, two- or three-dimensional images of the object under examination. This method for spatial encoding is hereinafter referred to as excitation encoding.

In the past, SDMM was initially performed using a single RF transmission antenna with an essentially homogeneous transmission field ($B_1$ field) in conjunction with the gradient system. Inspired by the success of parallel imaging in which signal acquisition with a configuration of multiple RF antennas (also termed an antenna array in the specialist literature) consisting of a plurality of individual antennas or elements, it has now become customary to also use such antenna arrays consisting of multiple elements operated on multiple, independent RF transmission channels of the MR measurement apparatus for transmission in SDMM. In this way, it is possible to partially replace the spatial encoding, which is implemented in SDMM by analogy with data acquisition, by varying supplementary magnetic fields, by so-called sensitivity encoding and thus to reduce the length of the excitation pulses. This enables use of the different spatial variations of the RF transmission fields of the individual array elements, hereinafter also referred to as transmission profiles.

Because, in the case of one-channel transmission, the length of selective excitation pulses is usually one of the criteria limiting the applicability of this technique, parallel excitation (PEX) or mufti-channel excitation is a promising approach by which spatially selective excitation may be deployed more widely than it has been. Spatial encoding during transmission of RF pulses for the purpose of selective excitation (hereinafter referred to as transmission spatial encoding) enables the amplitude and phase of the transverse magnetization produced during transmission to be set depending on the position. This transmission spatial encoding differs both from classic acquisition spatial encoding, which is performed without RF irradiation as part of data acquisition in a period following the excitation, in particular, during data acquisition, and also from the excitation encoding mentioned above, in which spatial encoding phase distribution of the transverse magnetization of the nuclear spins is already available after the excitation period.

One of the basic tasks when using SDMM is determination of the RF pulses to be replayed by the RF transmission system of the MR measurement apparatus to generate the required position-dependent change in the magnetization in conjunction with supplementary magnetic fields. In the article cited in the introduction "Designing Multichannel, Multidimensional, Arbitrary Flip Angle RF Pulses Using an Optimal Control Approach" (Xu, D., King, K. F., Zhu, Y., McKinnon, G. C., Liang, Z. P.: *Designing Multichannel, Multidimensional, Arbitrary Flip Angle RF Pulses Using an Optimal Control Approach*, Magnetic Resonance in Medicine 59 (2008), 547-560), Xu et al. describe a method for mufti-channel position-dependent change in the magnetization, by which the desired RF pulse shapes $B_{1,n}(t)$ can be calculated for each of the I=1 . . . n transmission channels based on the defined linear gradients of the k-space trajectory to be produced.

The calculation method of the RF pulses used for SDMM is generally based on the well-known Bloch equations for description of the development of the magnetization in an object during the influence of external magnetic fields. In Xu, D., King, K. F., Zhu, Y., McKinnon, G. C., Liang, Z. P.: *Designing Multichannel, Multidimensional, Arbitrary Flip Angle RF Pulses Using an Optimal Control Approach*, Magnetic Resonance in Medicine 59 (2008), 547-560, the pulse design problem based on the Bloch equations is expressed as an "optimal control" problem and the desired RF pulses are calculated by finding the solution to this problem.

As described above, in magnetic resonance imaging and in spatially resolved magnetic resonance spectroscopy, both during image acquisition and during SDMM, supplementary magnetic fields are usually used for spatial encoding that each have a spatially constant gradient in one spatial direction over the entire examination volume of the MR measurement apparatus. Because of this property of covering the entire examination volume, these supplementary magnetic fields are referred to as global gradients and the system component producing them as the global gradient system. Further, to simplify representation, it is assumed hereinafter that the basic field is oriented in the z-direction of a magnet-related coordinate system and that the gradients can be switched in three variants $G_x$, $G_y$ and $G_z$, whose z-components increase essentially linearly with settable strength in mutually orthogonal directions (see Bernstein, M. A., King K. F., Zhou, X. J.: *Handbook of MRI Pulse Sequences*. Elsevier Academic Press (2004) and de Graaf, R. A.: In vivo NMR spectroscopy. John Wiley & Sons Ltd (1998)).

Application of the strongest possible gradients, that is, the formation of the largest possible magnetic field difference between the edges of the examination volume, has substantial advantages which include implementation of very high position resolution. The fastest possible switching behavior for switch-on and switch-off of these gradients and setting of the gradient strength are also advantageous, for example, to shorten the total measurement procedure.

One disadvantage of the use of global gradients is that the gradient strengths required for typical applications correspond to considerable magnetic field differences between the edges of the mapping region. Their implementation reaches technical limits to the design of gradient coils and to the design of the gradient amplifiers in terms of size and switching behavior of the electric current to be generated by the gradient coils. Moreover, during rapid switching of these magnetic fields, rapidly changing Lorentz forces occur in the components of the MR measurement apparatus that can disadvantageously result in very large mechanical loads on the MR measurement apparatus and in excessive noise emission. A further limitation is imposed by neural stimulation of living objects under examination due to rapidly changing magnetic field strengths, so that in many cases, the image quality that would be technically possible cannot be achieved due to physiological restrictions with respect to acoustic load and nerve stimulation.

To avoid these limitations on global gradients, so-called local gradients were introduced for acquisition of magnetic resonance signals (see DE 10 2005 051 021 A1 and Hennig, J., Welz, A. M., Schultz, G., Korvink, J., Liu, Z., Speck, O., Zaitsev, M.: *Parallel imaging in non-bijective, curvilinear magnetic field gradients: a concept study*, Magn. Reson. Mater. Phy. 21 (2008), 5-14). These are usually produced with a local gradient system that is included in the apparatus in addition to the global gradient system. The supplementary magnetic fields for spatial encoding are also produced with such a local gradient system. Unlike global gradients, in the case of local gradients, the z-component $B_z$ (x,y,z) of each individual variant of the supplementary magnetic field is only either monotonically increasing or monotonically falling within each of one or more extensive and mutually contiguous partial regions of the examination volume along the gradient direction of the z-component ($\partial B_z(x,y,z)/\partial x$, $\partial B_z(x,y,z)/\partial y$, $\partial B_z(x,y,z)/\partial z$). However, in the examination volume as a whole, there is no monotonic progression of $B_z$ along this gradient direction. With one variant of such a local supplementary magnetic field, one-dimensional position determination along the stated gradient direction can be performed and components of the acquired magnetic resonance signals can be assigned to the individual iso-surfaces of the z-components $B_z(x,y,z)$ of the corresponding variant of the supplementary magnetic field. These iso-magnetic field surfaces are locally perpendicular to the gradient directions and must be known for spatial reconstruction from the magnetic resonance signals.

If position determination of the magnetic resonance signals is to be performed in multiple spatial dimensions, the corresponding number of suitable variants of the supplementary magnetic field, hereinafter referred to as $F_1$, $F_2$, . . . , are required. These can also be active simultaneously, depending on the encoding method. In the case of multi-dimensional spatial encoding using the local gradient system alone, unique spatial encoding is only possible in regions in which all variants of the supplementary magnetic field used for that purpose exhibit a monotonic dependence in the sense described above. These regions in which unique spatial encoding can be performed for all desired dimensions are hereinafter referred to as MSEM regions (MSEM=monotonic spatially encoding magnetic field).

The advantage to be gained from using such local gradients is that, within each of these MSEM regions, a spatially encoded magnetic field can be produced with a very steep rise and fast switching behavior. Among other purposes, this can be used to increase the spatial resolution in acquisition of magnetic resonance signals and/or to shorten the measurement operation. Because the magnetic field difference between the edges of an MSEM region and therefore also the magnetic field variation within the entire examination volume can be kept considerably smaller than in the case of global gradients, the disadvantages stated above of large, time-variable magnetic field variations within the nuclear resonance apparatus can be considerably reduced or avoided.

If magnetic resonance signals from the entire examination volume are spatially encoded using such a local gradient system, it is generally not possible, in the case of non spatially selective signal generation or acquisition, to make a spatial assignment of the MR signals based on the spatial encoding that is globally unique, that is, unique throughout the object under examination. In the case of a single MSEM region, it is not possible to ascertain which component of the signal originates from this region and which from outside. In the case of multiple MSEM regions, it is also generally not possible to distinguish which signal components originate from which MSEM region. In the case of a single MSEM region, this problem is usually solved by using excitation and/or reception antennas with restricted spatial sensitivity, in particular, so-called surface coils, so that only magnetic resonance signals within this MSEM region are excited and/or measured. In the case of local gradient systems that have multiple MSEM regions, unique assignment of the signal is achieved because unique assignment is possible using an antenna array with at least an equal number of suitably disposed reception elements of different sensitivity, as described in Pauly, J., Nishimura, D., Macovski A.: *A k-space analysis of small-tip-angle excitation*, Journal of Magnetic Resonance 81 (1989), 43-56; Katscher U., Börnert, P., Leussler, C., van den Brink, J. S.: *Transmit SENSE*, Magnetic Resonance in Medicine 49 (2003), 144-150; Meyer, C. H., Pauly, J. M., Macovski, A., Nishimura, D. G.: *Simultaneous spatial and spectral selective excitation*, Magnetic Resonance in Medicine 15 (1990), 287-304; Setsompop, K., Alagappan, V., Gagoski, B., Wald, L., Adalsteinsson, E.: *Uniform Wideband Slab Selection with B1+Mitigation at 7T via Parallel Spectral-Spatial Excitation*, Proceedings 16th Scientific Meeting, International Society for Magnetic Resonance in Medicine (2008), 616; Schomberg, H., Börnert, P.: *Off-resonance correction of nD spatially selective RF pulses*, Proceedings 6th Scientific Meeting, International Society for Magnetic Resonance in Medicine (1998), 2059 and Börnert, P., Aldefeld, B.: *On spatially selective RF excitation and its analogy with spiral MR image acquisition*, Magnetic Resonance Materials in Physics, Biology and Medicine 7 (1998), 166-178. This may necessitate a complex reconstruction method, for example, SENSE-like reconstruction (see Pruessmann, K. P., Weiger, M., Scheidegger M. B., Boesiger, P.: *SENSE: Sensitivity Encoding for Fast MRI*, Magnetic Resonance in Medicine 42 (1999), 952-962); Meyer, C. H., Pauly, J. M., Macovski, A., Nishimura, D. G.: *Simultaneous spatial and spectral selective excitation*, Magnetic Resonance in Medicine 15 (1990), 287-304; Setsompop, K., Alagappan, V., Gagoski, B., Wald, L., Adalsteinsson, E.: *Uniform Wideband Slab Selection with B1+Mitigation at 7T via Parallel Spectral-Spatial Excitation*, Proceedings 16th Scientific Meeting, International Society for Magnetic Resonance in Medicine (2008), 616; Schomberg, H., Börnert, P.: *Off-resonance correction of nD spatially selective RF pulses*, Proceedings 6th Scientific Meeting, International Society for Magnetic Resonance in Medicine (1998), 2059; Börnert, P., Aldefeld, B.: *On spatially selective RF excitation and its analogy with spiral MR image acquisition*, Magnetic Resonance Materials in Physics, Biology and Medicine 7 (1998), 166-178).

Unlike the developments described above in the field of acquisition of magnetic resonance signals, the position-dependent change in the magnetization SDMM according to prior art is still achieved with methods based on linear supplementary magnetic fields and is therefore also limited in its performance by technical and physiological constraints. These constraints limit the spatial resolution with which the change of magnetization can be performed, and/or require a certain minimum irradiation duration of the combination of RF pulses and supplementary magnetic fields to achieve the desired change in magnetization. The restriction of this spatial resolution and the delay caused by the minimum irradiation duration within the MR measurement sequence result in less favorable measurement conditions in many cases.

The object of this invention is therefore to provide a method for position dependent change in an object according to a requirement, in which this change in the magnetization is achieved with an at least locally spatially higher resolution and/or a shorter irradiation duration of the RF pulses and supplementary magnetic fields than is feasible according to prior art with linear supplementary magnetic fields produced by conventional gradient systems. In particular, this should be possible under the same technical and physiological conditions that currently constrain the performance of the methods using linear supplementary fields that are currently known in prior art.

SUMMARY OF THE INVENTION

This object is solved in a surprisingly simple but effective way in that non-linear supplementary magnetic fields are used, whose spatial gradient of the z-component is not constant at least at one instant during the irradiation, and that the radio-frequency pulses to be irradiated are calculated in advance, wherein progressions over time of the field strengths of the supplementary magnetic fields in the region of the object that are calculated and/or measured position-dependently are included in this calculation.

In the inventive method, for position dependent change in magnetization according to a requirement for this change, radio-frequency pulses are irradiated in conjunction with supplementary magnetic fields varying in space and over time that are superposed on the static and homogeneous basic field of the magnetic resonance measurement apparatus oriented in the z-direction in space. For this purpose, supplementary magnetic fields are used whose spatial gradient of the z-component is not constant, at least at one instant during the irradiation. The radio-frequency pulses can therefore not be calculated as in the previously disclosed methods that assume a linear spatial dependence of the supplementary magnetic fields so that their effect can be described by movement along a trajectory in k-space. In the inventive method, calculation of the radio-frequency pulses is performed based on position-dependently calculated and/or measured progressions over time of the supplementary magnetic fields in the region of the object.

It can be advantageous to use a combination of calculation and measurement in determining the position-dependent temporal dependences of the supplementary magnetic field strengths in the region of the object. For example, the contribution of a supplementary magnetic field that retains its spatial dependence during irradiation and only varies in its global amplitude can be determined by measuring the spatial dependence for a fixed amplitude in a separate preliminary experiment and scaling this measured dependence, to determine the spatial and temporal progression of the supplementary magnetic field, with the temporal progression of the amplitude defined by the sequence control unit of the magnetic resonance measurement apparatus. Such combined determination comprising calculation and measurement can, for example, be considerably more time-saving than completely measurement-based determination of the spatial and temporal progression of the supplementary magnetic field strengths.

Variants and further advantageous characteristics and embodiments of the invention are described below.

As part of the inventive method, unique transmission spatial encoding is also to be possible throughout the object.

In an especially preferred variant of the inventive method, supplementary magnetic fields are used that are such that, if a single RF transmission antenna is used whose transmission profile covers the entire object, at least one group of equivalent positions necessarily occurs within the object as part of SDMM. These are characterized by the fact that the change in the magnetization cannot be performed on them mutually independently, whatever the magnitude of position resolution. The simplest example of this is the fact that multiple positions exist in different regions of the object under examination at which the temporal field progression of the superposition of the supplementary magnetic fields is identical. In this case, an RF pulse that produces the same temporal RF field progressions at these positions as, for example, in irradiation with a spatially homogeneous transmission coil, would produce the same change in the magnetization so that only very special magnetization patterns whose symmetries correspond to those of the supplementary magnetic fields would be feasible. But even if the temporal field progression of the superposition of the supplementary magnetic fields at one position of such a group differs from those of another by, for example, an amount that is constant over time, the change in the magnetization at this position cannot be implemented independently of the other locations of the group.

To ensure that the change in the magnetization can nevertheless be performed at least at one position of a group independently of the other positions of the group, at least two RF transmission antennas are used that contribute to spatial encoding by their different transmission profiles in the region of the object. In this way, at least partial differentiation between equivalent positions in SDMM can be achieved.

In a further advantageous variant of the inventive method, the supplementary magnetic fields are such that the change in the magnetization can be performed with resolution varying over space. This is useful, for example, if the supplementary magnetic fields only permit a change in the magnetization with higher resolution at certain positions of the object that are of interest for the MR examination, while at less interesting positions only low resolution is possible, and if the supplementary magnetic fields have in total a lower maximum field strength than linear supplementary magnetic fields, which enable the higher resolution in the entire object. This lower maximum field strength can contribute to reducing the technical requirements of the gradient system producing the supplementary magnetic fields or to reducing the danger of peripheral nerve stimulation by supplementary magnetic fields that change excessively.

A very useful variant of the inventive method is to choose the setting of the position dependent change in the magnetization such that the inventive method causes a non-vanishing change in the magnetization only in one or more regions within the object. This can be used, for example, to produce transverse magnetization from the initial longitudinal magnetization only at certain positions as part of spatially selective excitation.

In this context, it can be advantageous to adapt the region(s) to anatomical, morphological or functional properties of the object under examination so that in this way, for example, certain regions of the object under examination that may interfere with the measurement are excluded from the excitation.

If a local gradient system is used for data acquisition that does not permit unique spatial encoding in the entire object, for example during spatially selective excitation only those region(s) can be excited whose union can be uniquely spatially encoded during data acquisition.

A further variant of the inventive method is particularly useful that is characterized in that the phase of the transverse magnetization is changed according to a defined spatial distribution. This can be advantageously used, for example, for pre-compensation of dephasing of the MR signal due to susceptibility during an imaging experiment and therefore for attenuation of signal losses by calculating the phase pattern used for phase compensation (that is, the spatial phase distribution of the transverse magnetization) in advance from the parameters of the imaging experiment.

This variant of the method can be further varied by performing the change in the spatial distribution of the phases of the transverse magnetization repeatedly in a magnetic resonance experiment in at least two so-called phase encoding periods in accordance with a spatial encoding scheme, by performing data acquisition after each of these phase encoding periods, and by reconstructing and storing and/or displaying as an image the totality of the data thus acquired having resolved it spatially according to the spatial encoding scheme. In this variant, the change in the phase patterns of the transverse magnetization is used to achieve partial or complete spatial encoding of the magnetic resonance signals during the change in magnetization. By repeated changes in multiple phase encoding periods with different phase patterns defined according to a phase encoding scheme and each followed by data acquisition, a total data set is obtained that is then reconstructed having been resolved spatially according to the spatial encoding scheme and, for example, provides two- or three-dimensional images of the object under examination. Further advantages of this variant are identical to the advantages described in DE 10 2007 044 463 B4 (e.g. direct acquisitions of FIDs, use of basically identical gradient pulses in all phase encoding periods, spatial variation of spatial resolution) because the method described in DE 10 2007 044 463 B4 essentially differs from this variant in that it is based on description of the supplementary magnetic fields as a k-space trajectory.

This variant is an example of how, with the inventive method, distributions of the amplitude and/or phase of the transverse magnetization can be produced that have a consistent pattern for the entire examination volume independently of the distribution of the examination volume in regions with different magnetic field progressions, for example, if the examination volume comprises multiple MSEMS. This variant enables, for example, spatial encoding of the MR signals to be performed for the entire examination volume or any mapping volume contained therein in such a way that image reconstruction is possible with a simple classic Fourier transform without having to take into account the special aspects of the non-linear supplementary magnetic fields in the reconstruction.

Conventional methods for position dependent change in the magnetization in an object under examination always require supplementary magnetic fields with a linear spatial dependence within the object, as is stated, for example in Xu, D., King, K. F., Zhu, Y., McKinnon, G. C., Liang, Z. P.: *Designing Multichannel, Multidimensional, Arbitrary Flip Angle RF Pulses Using an Optimal Control Approach*, Magnetic Resonance in Medicine 59 (2008), 547-560, equations 1 and 7, by the representation of the supplementary magnetic field as the product $G(t) \cdot r = \Delta B_0(t,r)$, that is, the product of the gradient $G(t)$, which is spatially constant because it is position independent, with the position coordinate r itself. In more specific conventional methods that are limited to spatially selective excitation in the small-angle regime (see Pauly, J., Nishimura, D., Macovski A.: *A k-space analysis of small-tip-angle excitation*, Journal of Magnetic Resonance 81 (1989), 43-56 for example) this precondition is also necessary (see equation 1 ibid). The characteristic of the constant gradient is still used in this method to introduce the concept of the "transmission k-space" (see ibid. eqs. 7 and 8), which differs slightly from the usual reception k-space. For a defined temporal progression of the gradient, the transmission k-space coordinate is defined as $$k(t) = -\gamma \int_t^T dt' G(t'), \quad (1)$$

wherein T denotes the total duration of the application of the supplementary magnetic fields and $\gamma$ the gyromagnetic ratio of the examined nucleus. With this definition, it is possible to express the phase onto which the infinitesimal transverse magnetization produced at instant t is superposed by the supplementary magnetic fields while these fields are still being applied, as a function of the linear product $k(t) \cdot r$ and derive a design equation $$M_{xy}(r) = i\gamma M_0(r) \int_0^T dt\, B_1(t) \exp[i(k(t) \cdot r)] \quad (2)$$

(see ibid. eq. 13). The conventional small-angle methods always work with design equations similar to equation (2) and therefore with the concept of the transmission k-space. However, this concept can only be defined for global constant gradients. The conventional pulse calculation methods are therefore unsuitable for a change in the magnetization using supplementary magnetic fields whose spatial gradient is not constant for at least one instant.

To circumvent this problem, it is conceivable to introduce a local k-space concept that is only valid for limited areas in the mapping area. However, the RF pulse calculation necessary for the inventive variant of the position dependent change in the magnetization is a more direct solution, as is expounded below.

First, an example is described of how the inventive pulse calculation can be performed for the range of small flip angles (<15°). According to the inventive method, the phase $\phi$ onto which the infinitesimal transverse magnetization produced at instant t is superposed (in the usual small-angle approximation) by the supplementary magnetic fields while these fields are still being applied follows explicitly from the general spatial and temporal progressions of the supplementary magnetic fields $F_j(t,r)$ as $$\varphi(t, r) = -\gamma \int_t^T dt' \sum_j F_j(t, r). \quad (3)$$

This results in the following design equation in the small-angle regime $$M_{xy}(r) = i\gamma M_0(r) \int_0^T dt \sum_l S_l(r) I_l(t) \exp\left[-i\gamma \int_t^T dt' \sum_j F_j(t', r)\right]. \quad (4)$$

Here, $S_l(r)$ are the transmission profiles of the RF transmission antenna associated with RF pulse shape $I_l(t)$. Further, r denotes the position variable; t, the time variable; $M_0(r)$, the position-dependent initial magnetization; $\gamma$, the gyromagnetic ratio of the examined nucleus; T, the total duration of the longest RF pulse and the application of the supplementary magnetic fields; and $M_{xy}(r)$, the position-dependent transverse target magnetization. In this case, setting a target magnetization is equivalent to setting a position dependent change in the magnetization because the initial magnetization is defined.

The solution to the design equation (4) according to the RF pulse shapes $I_l(t)$ is obtained numerically by the generally known conjugate gradient method after discretization and conversion to a quadratic minimization problem.

This method for position dependent change, wherein the described RF pulses and supplementary magnetic fields are used, differs from an existing method for position dependent change in the magnetization using measured phase progressions φ(t,r) (see Ullmann, P., Haas, M., Hennel, F., Wick, M., Voiron, J., Zaitsev, M., Hennig, J., Ruhm, W.: *Parallel Excitation Experiments Using Measured k-Space Trajectories for Pulse Calculation*, Proceedings 16th Scientific Meeting, International Society for Magnetic Resonance in Medicine (2008), 1313,14 and patent application submitted to the German Patent and Trade Mark Office on 2009-04-01 with official application number 10 2009 002 112.4), in particular, in that the latter is based on experimentally measured phase dependences while this method is defined based on spatial and temporal progressions of the supplementary magnetic fields $\Delta B_0(t,r)$, in particular, if these can be calculated as a product of statically measured or simulated spatial field progressions with defined temporal progressions according to $$\Delta B_0(t, r) = \sum_j F_j(r) A_j(t) \quad (5)$$

Now, one possible variant of the RF pulse calculation, required to apply the inventive method, for the range of any flip angles is described by way of example. For this purpose, a small-angle RF pulse is initially calculated, as described above, by suitably adapting the position-dependent target magnetization. The resulting RF pulse, that is, the totality of the RF pulse shapes for all RF transmission antennas, is now scaled with a factor that corresponds to the ratio between any desired flip angle of the magnetization and the postulated flip angle of the magnetization in the small-angle calculation (<15°). The scaled RF pulse is the starting point for the following iterative optimization by means of optimal control.

In this method, the Bloch equation is solved iteratively and, with each iteration, the RF pulse shapes are improved in that the combined application of the supplementary magnetic fields and the RF pulses causes a change in the position-dependent magnetization that approximates ever more closely to the defined target.

Integration of the Bloch equation for the magnetization at each position r $$\begin{pmatrix} \dot{M}_x(t, r) \\ \dot{M}_y(t, r) \\ \dot{M}_z(t, r) \end{pmatrix} = \gamma \begin{pmatrix} 0 & \Delta B_0(t, r) & -B_{1,y}(t, r) \\ -\Delta B_0(t, r) & 0 & B_{1,x}(t, r) \\ B_{1,y}(t, r) & -B_{1,x}(t, r) & 0 \end{pmatrix} \cdot \begin{pmatrix} M_x(t, r) \\ M_y(t, r) \\ M_z(t, r) \end{pmatrix} \quad (6)$$

is performed based on the initial state of the magnetization for the total duration of the application of the supplementary magnetic fields and the RF pulses from t=0 to t=T. Here, $B_{1,x}(t,r)$ and $B_{1,y}(t,r)$ are the real and imaginary part of the transmission field. The progression of the supplementary magnetic fields as the product $G(t)\cdot r = \Delta B_0(t,r)$ from prior art is not suitable here. For this reason, according to the invention, the spatial and temporal dependences of the supplementary magnetic fields $\Delta B_0(t,r)$ is directly included in the Bloch equation (6). In a variant of the inventive method, this dependence $\Delta B_0(t,r)$ can be obtained from simulated and/or measured spatial supplementary field dependences and defined temporal progressions according to equation (5).

Integration of the Bloch equation yields the position dependent magnetization that theoretically results during application of the supplementary magnetic fields and the RF pulses of each iteration. In each iteration, this resulting magnetization is compared with the target magnetization that was defined by setting the change. Once the deviation falls below a defined, suitably chosen, magnitude, the iteration is terminated because the required RF pulse (the totality of the RF pulse shapes for all transmission antennas) has been found.

If the deviation $\lambda_i$ has not yet fulfilled the chosen criterion in the i-th iteration, the Bloch equation for $\lambda(t,r)$ is integrated instead for the full position dependent magnetization, with an initial condition at instant T of $\lambda(T,r)=\lambda_i$. Integration therefore progresses from t=T to t=0. In this step, the Bloch equation is used with the inventive calculation of the supplementary magnetic fields.

According to the principles of calculus of variations, improved large-angle RF pulse shapes $I_l(t)^{opt}$ are obtained from the calculated dependences M(t,r), $\lambda(t,r)$ and $I_l(t)$ and the transmission profiles according to $$I_l(t)^{opt} = I_l(t) - \mu \sum_r \lambda(t, r)^T \cdot \begin{pmatrix} 0 & 0 & -iS_l^*(r) \\ 0 & 0 & S_l^*(r) \\ iS_l^*(r) & -S_l^*(r) & 0 \end{pmatrix} \cdot M(t, r), \quad (7)$$

wherein a suitable increment μ is chosen. With the improved RF pulse shapes $I_l(t)^{opt}$, iteration is continued with forward integration of the Bloch equation.

In a variant of the inventive method, equivalent positions arise due to the use of non-linear supplementary magnetic fields that are characterized in that the magnetization as these two positions cannot be changed mutually independently based only on the progression of the supplementary magnetic fields and using one transmission antenna with a transmission profile covering the entire object, for example, if the progression of the superposition of the supplementary magnetic fields is identical. The inventive method permits, at least partially, independent change in the magnetization at these positions by using multiple transmission antennas with spatially different transmission profiles by the transmission of independent RF pulse shapes on these antennas and the therefore differing transmission fields at the equivalent positions.

Further advantages of the invention result from the description and the drawing. According to the invention, the characteristics stated above and further below can be used singly or in any combination. The embodiments shown and described are not intended to be an exhaustive list but are examples used to explain the invention.

The invention is represented in the figure and is explained in more detail with the help of an embodiment.

DESCRIPTION OF THE PREFERRED EMBODIMENT

Figure 1:
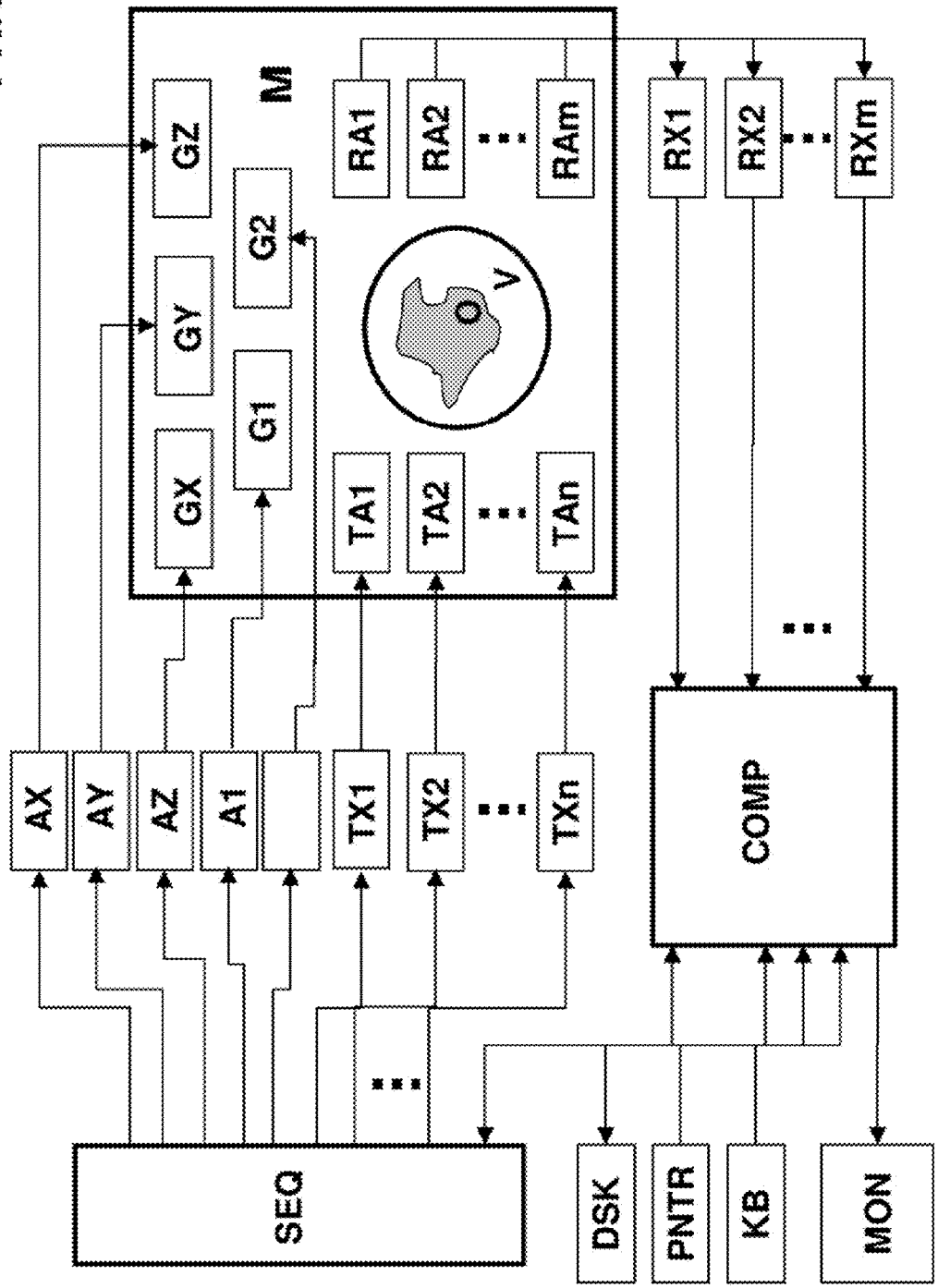
FIG. 1 a schematic representation of an MR measurement apparatus according to prior art suitable for performing the inventive method.
Figure 3:
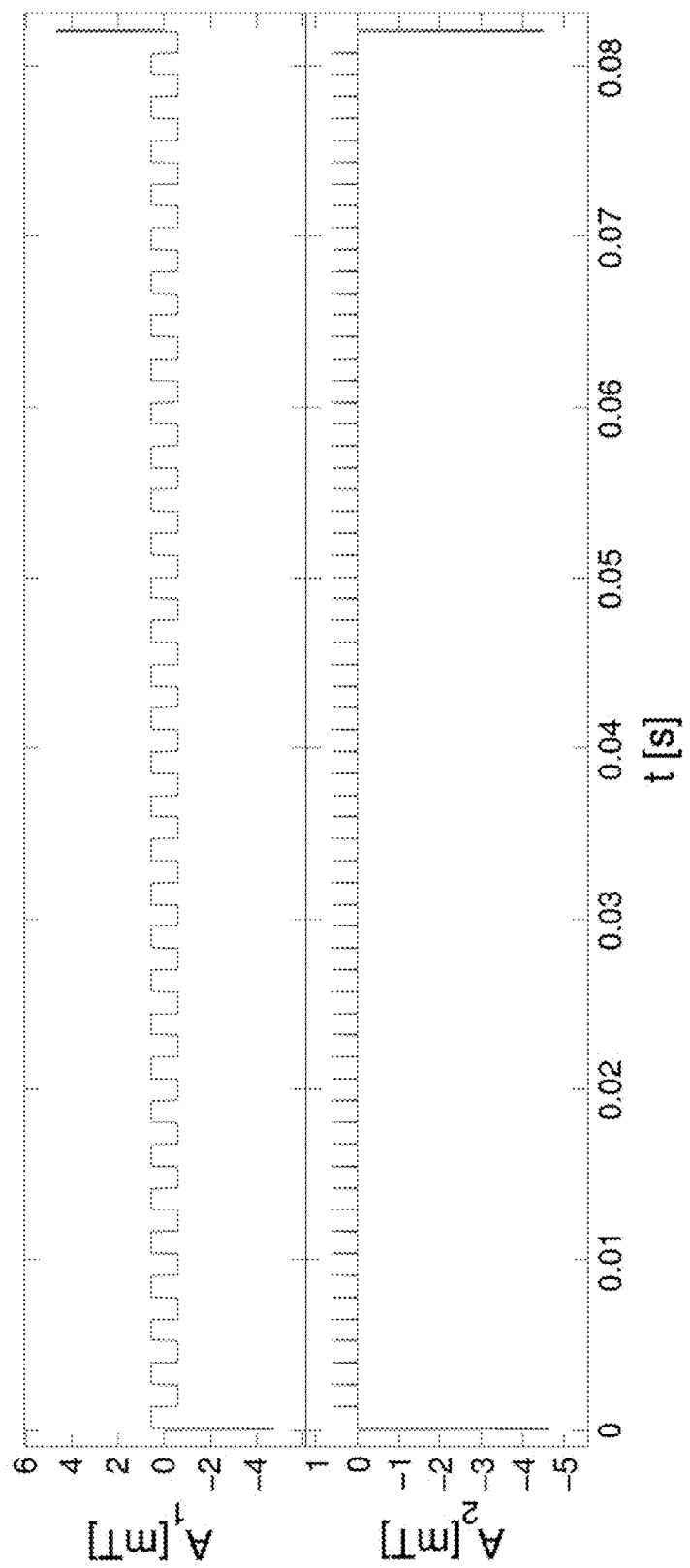
FIG. 3 the temporal progression $A_1$ and $A_2$ of the maximum amplitudes of the supplementary magnetic fields from FIG. 2 during application of the RF pulses. The spatial dependence of the supplementary magnetic fields is relative to this maximum amplitude, as shown in FIG. 2.

FIG. 1 schematically shows an MR measurement apparatus that is suitable for performing the inventive method. The system contains the main magnet M, with which the essentially homogeneous and static basic magnetic field is produced in a volume under examination V. The part of the object under examination that is contained in the volume under examination will subsequently be referred to as the object under examination or simply the object O. Surrounding this volume under examination V, a global gradient system, comprising three sets of gradient coils GX, GY, and GZ, and a local gradient system are put into the bore of the main magnet M with which different variants of local additional fields, local gradients, can be implemented by switching coils, usually multiple coils, to form coil combinations G1, G2. Global and local gradient systems do not have to be implemented as separate devices but may access shared gradient coils. FIG. 3 shows examples of 2 such coil combinations, G1 and G2. In both gradient systems, additional magnetic fields with controllable duration and strengths can be superposed on the basic field. With gradient amplifiers AX, AY, AZ, A1, and A2 that are controlled by a sequence control unit SEQ to produce gradient pulses at the right instant, the gradient coils sets GX, GY, GZ, G1, and G2 are supplied with electric power to produce the additional fields.

Within the gradient field system, there are multiple transmission elements, TA1 to TAn, that are together termed the transmission antenna equipment. They surround an object under examination O and are powered from multiple independent RF power transmitters TX1 . . . TXn. The RF pulses produced by these RF power transmitters TX1 . . . TXn are determined by the sequence control unit SEQ and triggered at the correct time. With the transmission elements TA1 to TAn, RF pulses are irradiated onto the object under examination O in the volume under examination V, where they excite nuclear spins. The magnetic resonance signals caused by this are converted into electrical voltage signals with one or more RF reception elements RA1, . . . , RAm, but are then fed into a corresponding number of reception units RX1, . . . , RXm. The reception elements RA1, . . . , RAm are together termed the reception antenna equipment consisting of m reception elements RX1, . . . , RXm. They are also located within the gradient coils GX, GY, GZ, and surround the object under examination O.

To reduce the complexity of the apparatus, the transmission and reception antenna equipment can be designed and connected in such a way that one or more of the transmission elements TA1 to TAn are also used to receive the magnetic resonance signals. In this case, which is not shown in FIG. 1, switchover between transmission and reception modes is assured by one or more of the electronic transmission-reception switches controlled by the sequence control unit SEQ, that is, that during the RF transmission phases of the executed pulse sequence, this antenna or these antennas are connected with the corresponding RF power transmitter or transmitters and disconnected from the allocated reception channel or channels, while, for the reception phases, transmitter disconnection and reception channel connection is performed.

With the reception units RX1 to RXm shown in FIG. 1, the signals received are amplified and converted to digital signals using known signal processing methods and passed on to an electronic computer system COMP. In addition to reconstruction of images, spectra and derived quantities from the measured data received, the control computer system COMP is used to operate the entire MR measurement apparatus and to initiate execution of the pulse sequences by appropriate communication with the sequence control unit SEQ. User-guided or automatic execution of programs for adjusting the measurement apparatus characteristics and/or for generating magnetic resonance images is also performed by this control computer system COMP, as are visualization of the reconstructed images and storage and administration of the measurement and image data and control programs. For these tasks, this computer system is equipped with at least one processor, a working memory, a computer keyboard KB, a pointing device PNTR, for example, a computer mouse, a monitor MON, and an external digital storage unit DSK.

An explanation of how the inventive method can be performed with such an MR measurement apparatus is given below using a specific embodiment. The results shown were obtained by calculated simulation of an MR experiment in which a postulated position dependent initial magnetization is converted to a position dependent target magnetization in an object under examination by irradiation of RF pulses and the simultaneous effect of supplementary magnetic fields according to the inventive method.

According to the invention, at least two supplementary magnetic fields are used (FIG. 2) that have a spatial gradient of the z-component that is not constant because the z-component depends non-linearly on position. The z-component of the superposition of these supplementary magnetic fields also has a non-constant gradient at all instants at which at least one of these supplementary fields is active.

By way of example, two equivalent positions are shown. It is demonstrated below for this example that if one transmission antenna is used at these two positions, an identical, and therefore only mutually dependent change in the magnetization is performed and the desired position dependent change in the magnetization is only partially implemented. Moreover, it is demonstrated that when eight transmission antennas with different spatial transmission profiles are used, according to the inventive method, a different, mutually independent change in the magnetization at these two positions can be effected and the desired change in the magnetization can therefore be implemented at both positions.

Figure 2:
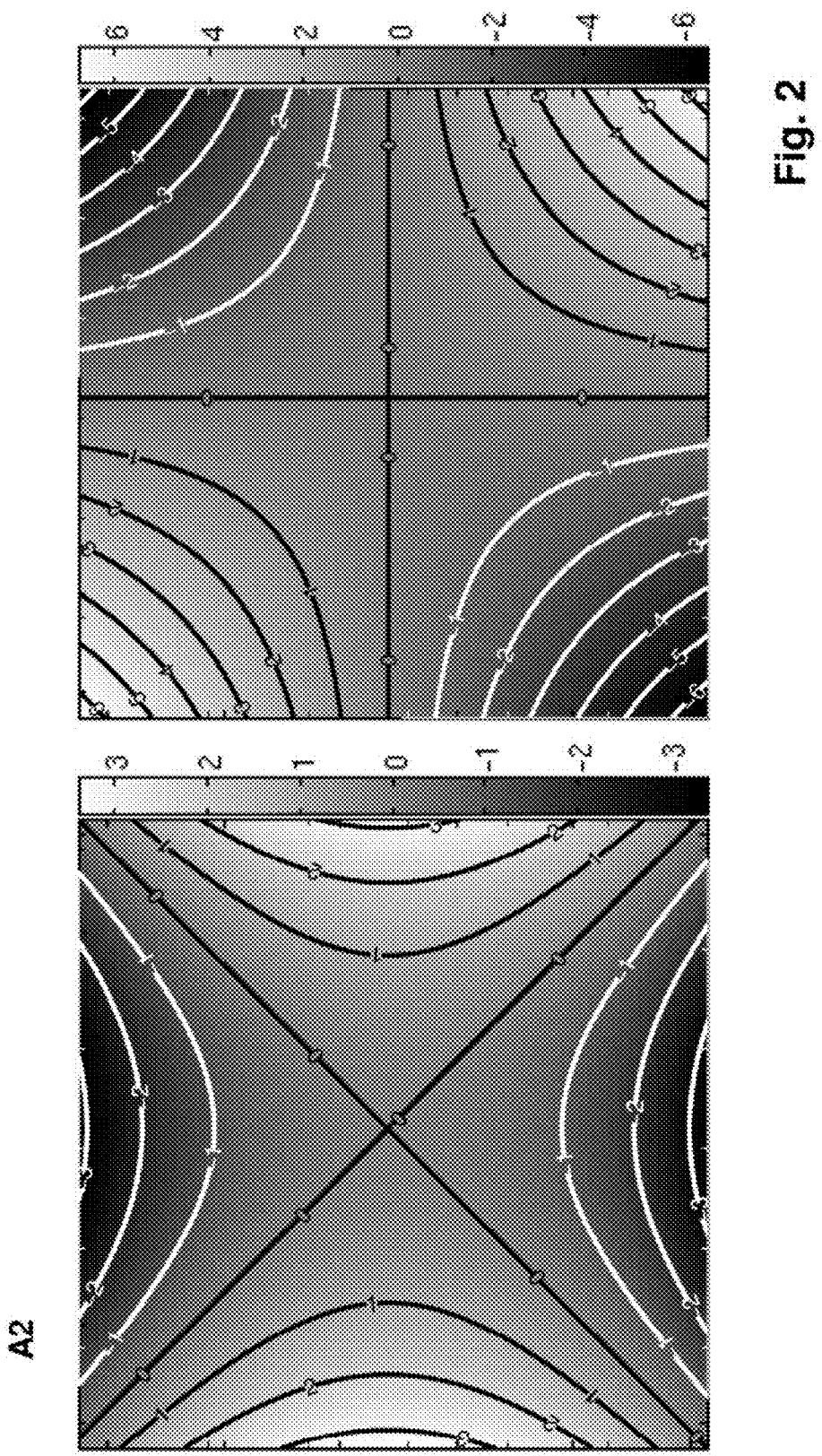
FIG. 2 the spatial dependence of the z-component of two supplementary magnetic fields $F_1$ and $F_2$ in a cut plane of the object that is applied during transmission and whose gradients of the z-component are not constant. The amplitude of the fields is stated in relative units and is scaled as a function of time according to the amplitude weighting shown in FIG. 3. The area shown is 6 cm×6 cm in size.

FIG. 2 shows the spatial dependences of the two supplementary magnetic fields used $F_1$ and $F_2$ that can be produced with coils G1 and G2 of the local gradient system in FIG. 1, while FIG. 3 shows the temporal progression of the amplitudes $A_1$ and $A_2$ of these fields during transmission of the RF pulses. By way of example, this therefore provides the basis for the calculation of the RF pulses.

Figure 4:
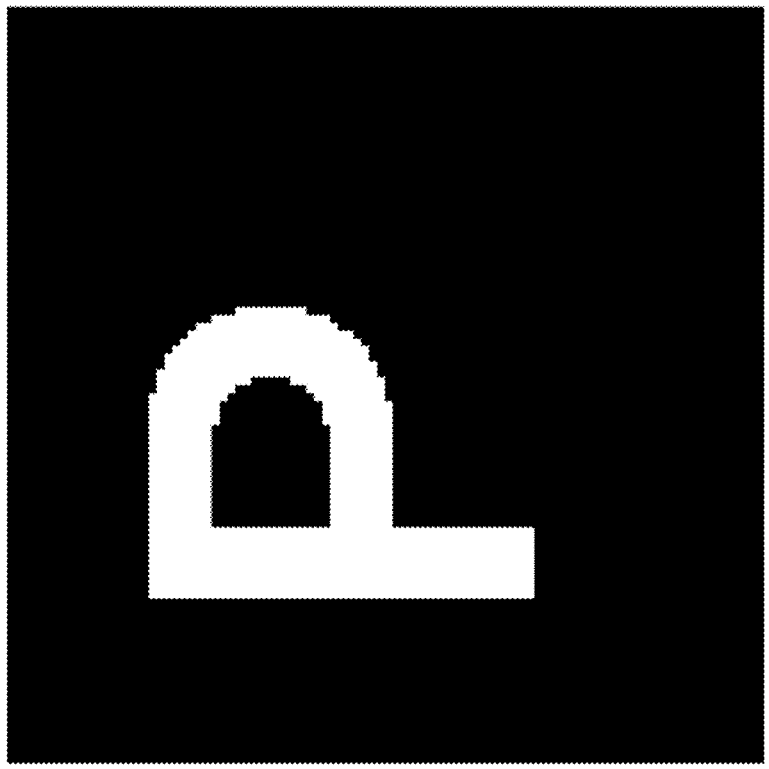
FIG. 4 the target distribution of the x-component for the position-dependent change in the magnetization in a cut plane of the object. The spatial extent of the distribution shown is 6 cm×6 cm. The area shown in white corresponds to a required pure x-magnetization while the areas shown in black represent a required pure z-magnetization.

The initial situation for this embodiment is magnetization M(0,r) that is position dependent in two dimensions within the object under examination, wherein the magnetization is oriented in the z-direction at each position of the two-dimensional object on a grid of 96×96 points with the extent 6 cm×6 cm. The strength of this z-component corresponds to the value $M_z(0,r)=M_0=\cos(0°)=1$. The specific position-dependent change in the magnetization with the inventive method is to be effected in such a way that, due to the combined application of the supplementary magnetic fields and of the RF pulses, the x-component of the magnetization is given the distribution shown in FIG. 4, also referred to as target distribution $M_T(r)$. Here, the areas shown in white correspond to a non-vanishing component $M_x$ of $\sin(90°)=1$ and the areas shown in black represent $M_x=0$. The z-component of the magnetization is to be reduced to $M_z=\cos(90°)=0$ in the white areas, while $M_y$ is to remain unchanged at zero everywhere.

An essential part of the inventive method is determination of the temporal progressions of the radio-frequency pulses to be irradiated. One possible procedure for this calculation is described below, for example, without going into varied alternatives and variations that are obvious to persons skilled in the art. First of all, to solve the Bloch equation iteratively below, a small-angle pulse is required as the starting point. The phase φ onto which the infinitesimal transverse magnetization produced at instant t is superposed by the supplementary magnetic fields while these fields are still being applied, is required for calculation of the small-angle pulse. This calculation is performed explicitly according to the inventive method from the known, in this case, electrodynamically calculated, spatial progressions of the supplementary magnetic fields $F_1$ and $F_2$ and the temporal progressions $A_1$ and $A_2$ defined by the sequence control of the MR measurement apparatus as $$\varphi(t, r) = -\gamma \int_t^T dt' F_1(r)A_1(t') + F_2(r)A_2(t'). \tag{8}$$

This results in the following design equation in the small-angle regime $$M_{xy}(r) = \tag{9}$$
$$i\gamma M_0(r) \int_0^T dt \sum_l S_l(r)I_l(t)\exp\left[-i\gamma \int_t^T dt' F_1(r)A_1(t') + F_2(r)A_2(t')\right].$$

Figure 7:
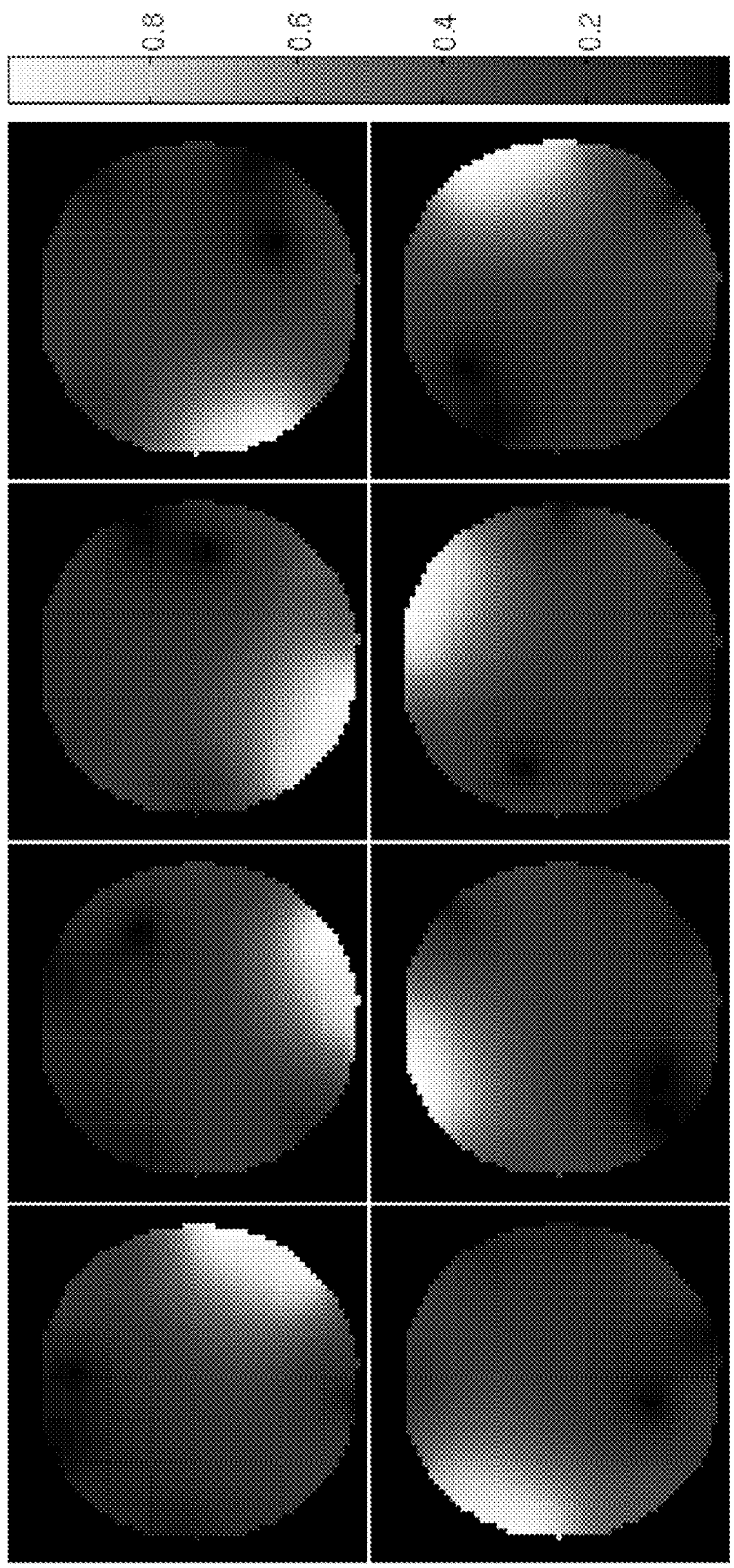
FIG. 7 the relative amplitudes of the spatial transmission profiles of the 8 transmission antennas that are included in the multi-channel pulse calculation. The pronounced spatial localization of the transmission profiles enables spatial differentiation between the equivalent positions that can be achieved, as in this example, with the use of non-linear supplementary magnetic fields.

Herein, $S_l(r)$ are the transmission profiles of the RF transmission antenna associated with RF pulse shape $I_l(t)$. FIG. 7 shows the relative amplitudes of the transmission profiles used. Further, r denotes the position variable; t, the time variable; M, the magnetization; γ, the gyromagnetic ratio of the proton; and T=83.1 ms, the total duration of the RF pulses and the application of the supplementary magnetic fields. The target magnetization distribution $M_{xy}(r)$ for the small-angle pulse design is derived from the target distribution described above (see also FIG. 4) that is set in the white areas $M_x=\sin(10°)=0.17$. $M_y$ is unchanged at zero. In the small-angle pulse design, $M_z$ is also assumed to be constant over time.

The solution of the design equation (9) according to the eight RF pulse shapes $I_l(t)$ is obtained numerically after discretization and conversion into a quadratic minimization problem with the generally known conjugate gradient method.

The small-angle pulses obtained in this way (totality of the eight RF pulse shapes) is now scaled by a factor of 9, that is, with the ratio between the desired flip angle of the position dependent magnetization (here 90°) and the postulated flip angle of the position dependent magnetization in the small-angle calculation (here 10°). The scaled RF pulse is the starting point for the following iterative optimization by means of optimal control.

The following iteration steps are now repeated until the deviation λ(r) of the simulated position dependent magnetization of a particular iteration from the desired position dependent magnetization is sufficiently small (see step 2).

Step 1:

The transmission field $B_1(t,r)$ is calculated from the eight RF pulse shapes and the eight transmission profiles by $$B_1(t, r) = \sum_l S_l(r) I_l(t) \quad (10)$$

and the z-component of the supplementary magnetic fields of the progression of the superposition $$\Delta B_0(t,r) = F_1(r) A_1(t) + F_2(r) A_2(t) \quad (11)$$

is calculated from the spatial and temporal progressions. With these functions, the Bloch equation $$\begin{pmatrix} \dot{M}_x(t,r) \\ \dot{M}_y(t,r) \\ \dot{M}_z(t,r) \end{pmatrix} = \gamma \begin{pmatrix} 0 & \Delta B_0(t,r) & -B_{1,y}(t,r) \\ -\Delta B_0(t,r) & 0 & B_{1,x}(t,r) \\ B_{1,y}(t,r) & -B_{1,x}(t,r) & 0 \end{pmatrix} \cdot \begin{pmatrix} M_x(t,r) \\ M_y(t,r) \\ M_z(t,r) \end{pmatrix} \quad (12)$$

starting from the initial magnetization $M(0,r)$ is numerically integrated forward in time at each position r until total duration T, with the result $M(T,r)$. Here, $B_{1,x}(t,r)$ and $B_{1,y}(t,r)$ are the real and imaginary part of the transmission field and the dependence of $M(t,r)$ is stored for each instant and position.

Step 2:

By calculating the vector difference between the position dependent magnetization obtained in step 1 and the target magnetization, the deviation $$\lambda(r) = M(T,r) - M_T(r) \quad (13)$$

is calculated. If the mean value of the squares of the absolute values of $\lambda$ is less than 0.025 over all positions, that is, the mean square deviation is therefore below 2.5%, the iteration is terminated at this point and the eight pulse shapes of the current iteration are the result of the large-angle RF pulse calculation. Otherwise, the calculation moves onto step 3.

Step 3:

The Bloch equation for the vector deviation $\lambda$ $$\begin{pmatrix} \dot{\lambda}_x(t,r) \\ \dot{\lambda}_y(t,r) \\ \dot{\lambda}_z(t,r) \end{pmatrix} = \gamma \begin{pmatrix} 0 & \Delta B_0(t,r) & -B_{1,y}(t,r) \\ -\Delta B_0(t,r) & 0 & B_{1,x}(t,r) \\ B_{1,y}(t,r) & -B_{1,x}(t,r) & 0 \end{pmatrix} \cdot \begin{pmatrix} \lambda_x(t,r) \\ \lambda_y(t,r) \\ \lambda_z(t,r) \end{pmatrix} \quad (14)$$

is integrated backward in time using the transmission fields and the superposition of the supplementary magnetic fields from step 1 at each position r (i.e. $\lambda = \lambda(T,r)$) is the starting point for integration in negative time increments until $t=0$), and the dependence of $\lambda(t,r)$ for each instant and position is stored. According to the known principles of calculus of variations which are the basis for optimal control methods, improved large-angle RF pulse shapes $I_l(t)^{opt}$ are calculated from the transmission profiles and progressions of $M(t,r)$, $\lambda(t,r)$ and $I_l(t)$ by $$I_l(t)^{opt} = I_l(t) - \mu \sum_r \lambda(t,r)^T \cdot \begin{pmatrix} 0 & 0 & -i S_l^*(r) \\ 0 & 0 & S_l^*(r) \\ i S_l^*(r) & -S_l^*(r) & 0 \end{pmatrix} \cdot M(t,r), \quad (15)$$

where an increment $\mu = 2.5 \times 10^{-8}$ was chosen. With the improved RF pulse shapes $I_l(t)^{opt}$, the calculation now continues with step 1.

Figure 5:
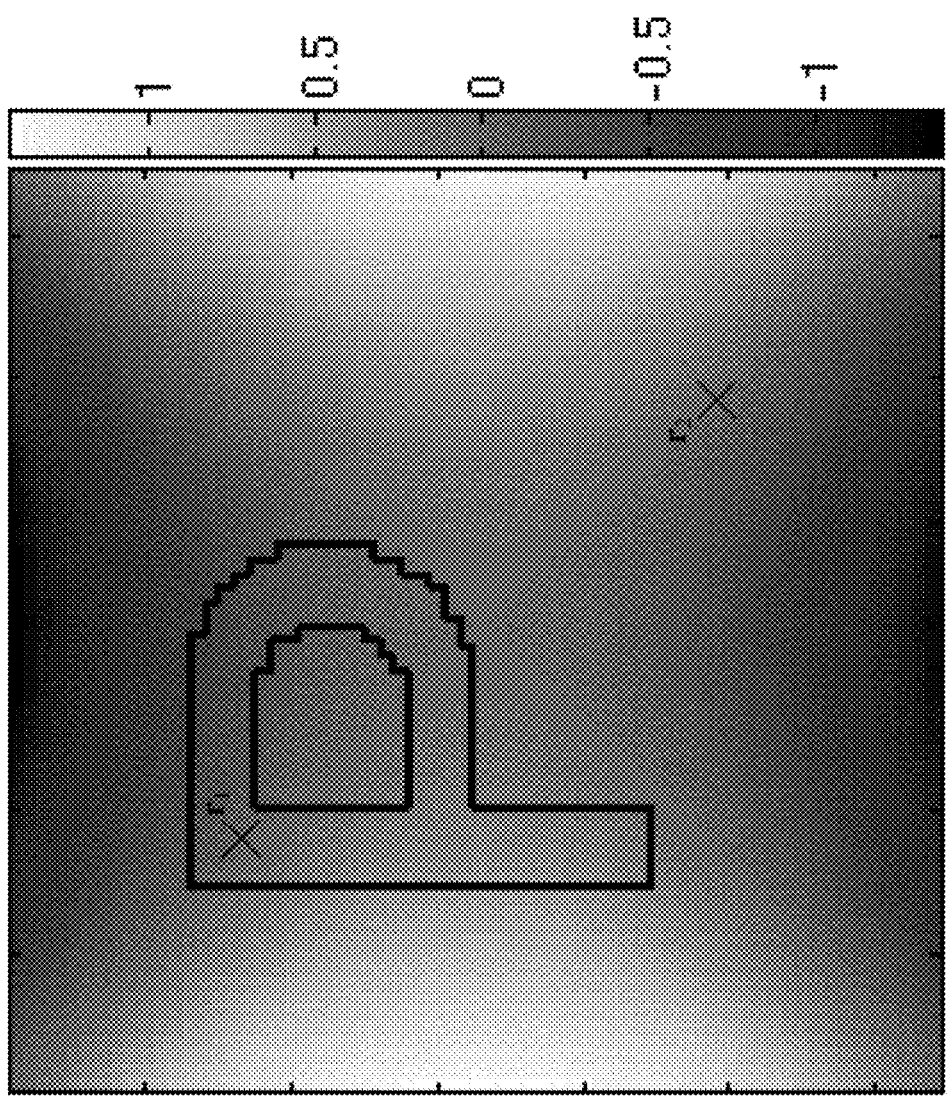
FIG. 5 two equivalent positions $r_1$ and $r_2$, indicated by black crosses, are superposed on the supplementary magnetic field $F_1$. An analogous image also results for $F_2$. The black superposed outline of the position-dependent target magnetization illustrates that different magnetization is required at the two positions.
Figure 6:
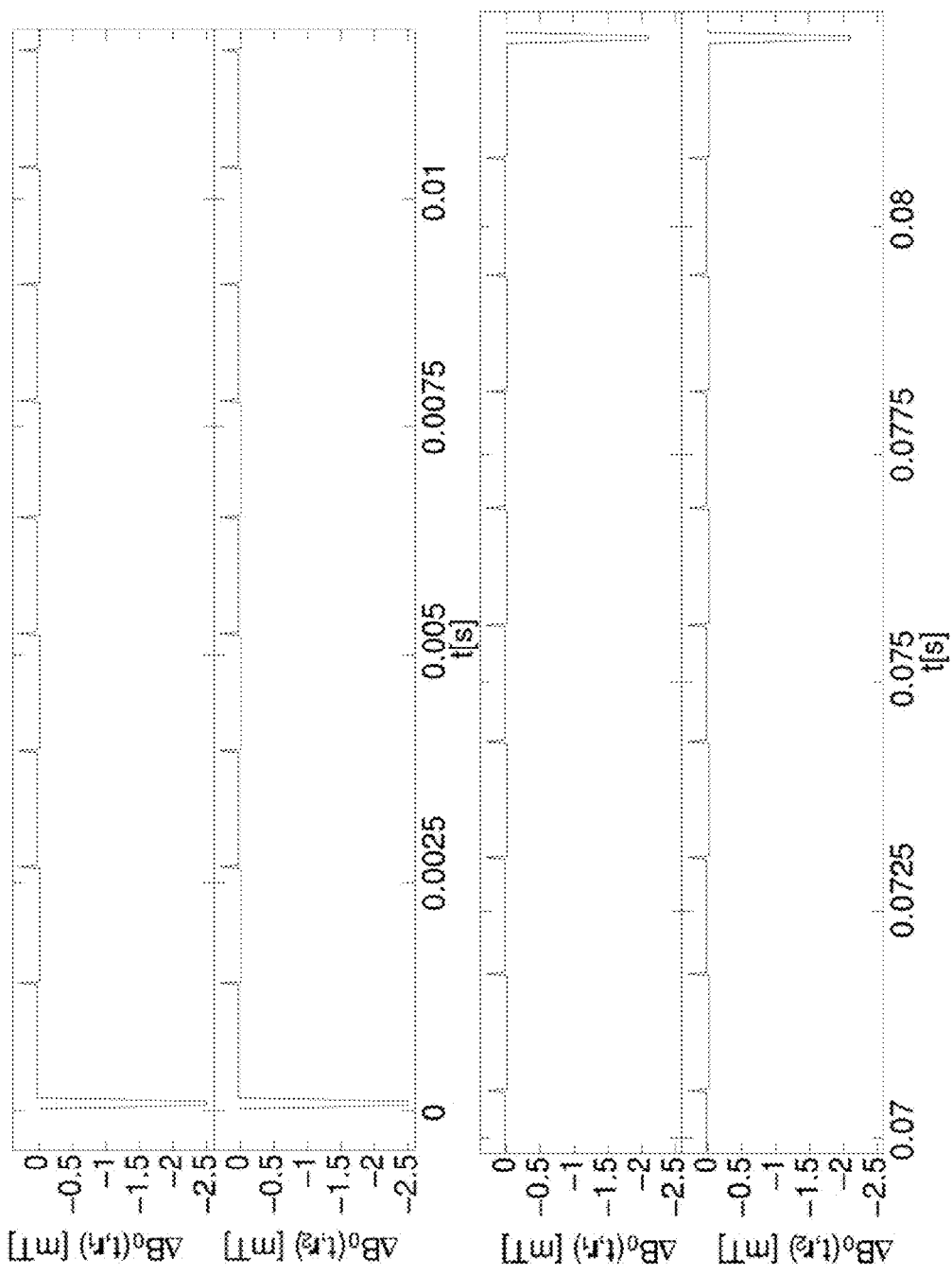
FIG. 6 the supplementary magnetic field strength $\Delta B_0(t,r)$ at the equivalent positions $r_1$ and $r_2$ (see FIG. 5) as a function of time. To provide an overview, the supplementary magnetic field strengths are only shown as examples at the beginning and end of the application. Due to the central symmetry of the two supplementary magnetic fields $F_1$ and $F_2$, the total dependence of the supplementary magnetic field strength is identical at both equivalent positions.
Figure 8:
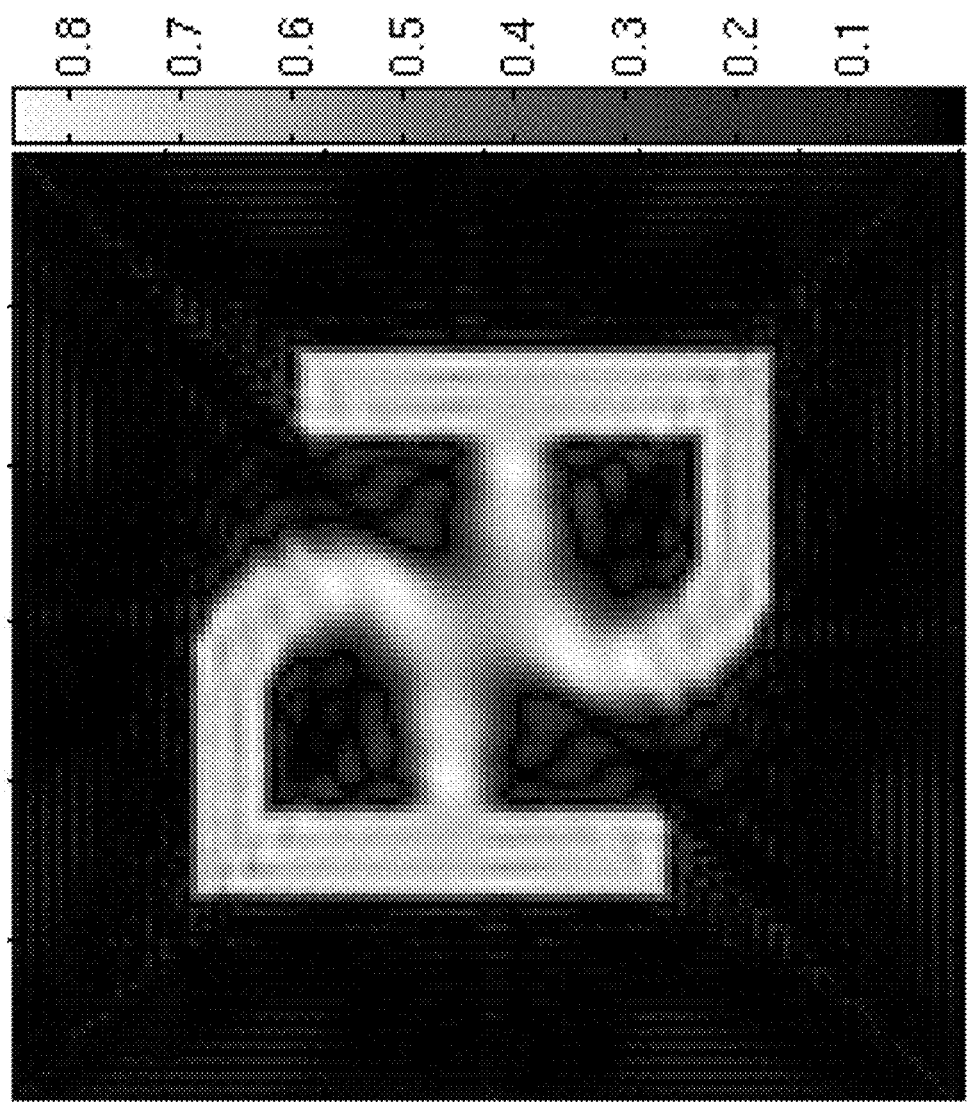
FIG. 8 the result of simulation of the changed position dependent magnetization after application of the supplementary magnetic fields with non-constant gradients and only one transmission antenna with an homogeneous spatial transmission profile. As a result of the existence of equivalent positions, significant transverse magnetization has arisen at positions other than the positions defined by the target distribution (see FIG. 4). The magnitude of the transverse magnetization is smaller than required by the target distribution.

FIG. 8 shows the result of a simulation of the position dependent change in the magnetization according to a method that corresponds to the inventive method except for the number of transmission coils used. The result of using exactly one transmission coil with homogeneous transmission profile shows an unwanted multiplication of the target pattern because, if only one transmission coil is used, independent change in the magnetization is not possible at equivalent positions, such as $r_1$ and $r_2$ (see FIG. 5).

Figure 9:
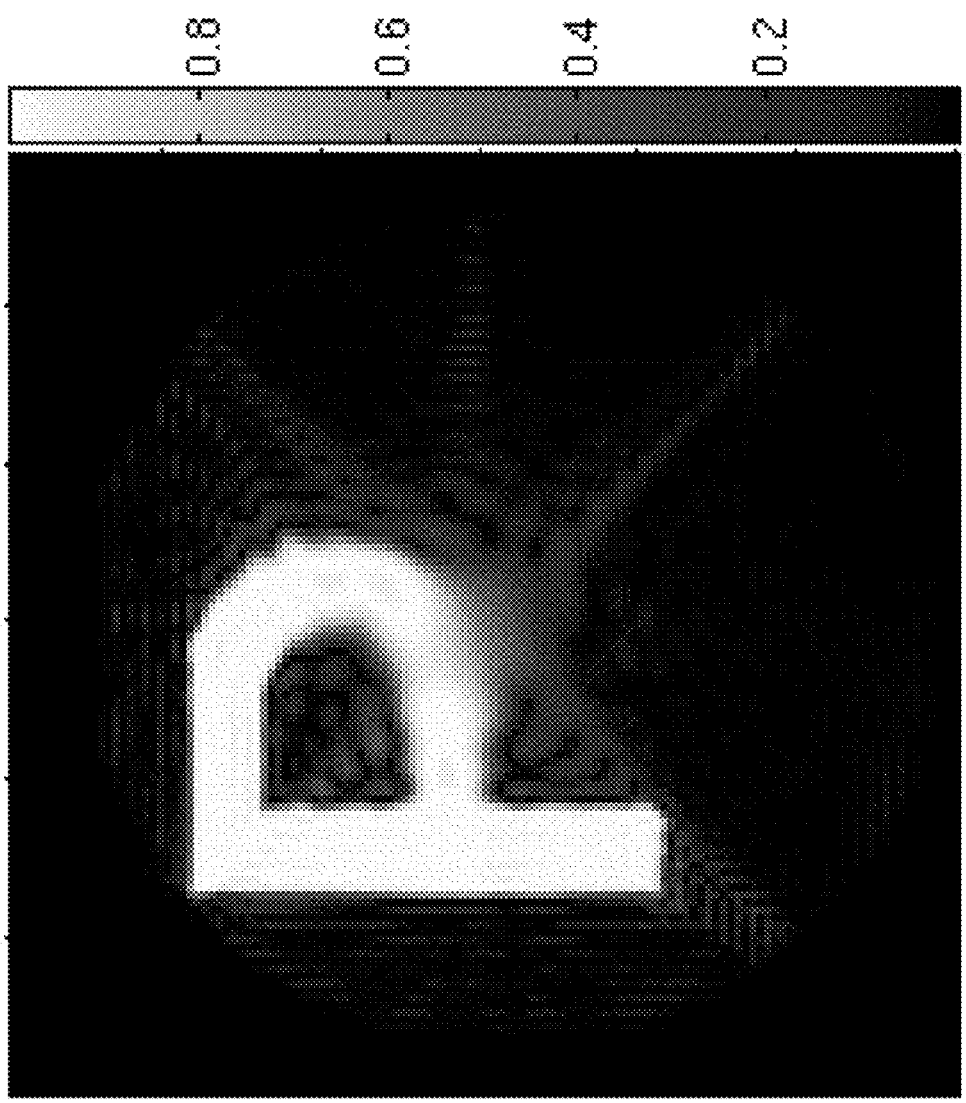
FIG. 9 the result of simulation of the changed position dependent magnetization according to the inventive method after application of the supplementary magnetic fields with non-constant gradients and RF pulses by eight transmission antennas with different spatial transmission profiles. Thanks to the use of multiple transmission antennas, the desired position-dependent magnetization can be achieved with sufficient precision.

The result of a simulation of the position-dependently modified magnetization according to the inventive method is shown in FIG. 9. Implementation of the target magnetization is enabled by the additional spatial selectivity of the eight transmission antennas used, TA1 to TA8 in FIG. 1.

Figure 10:
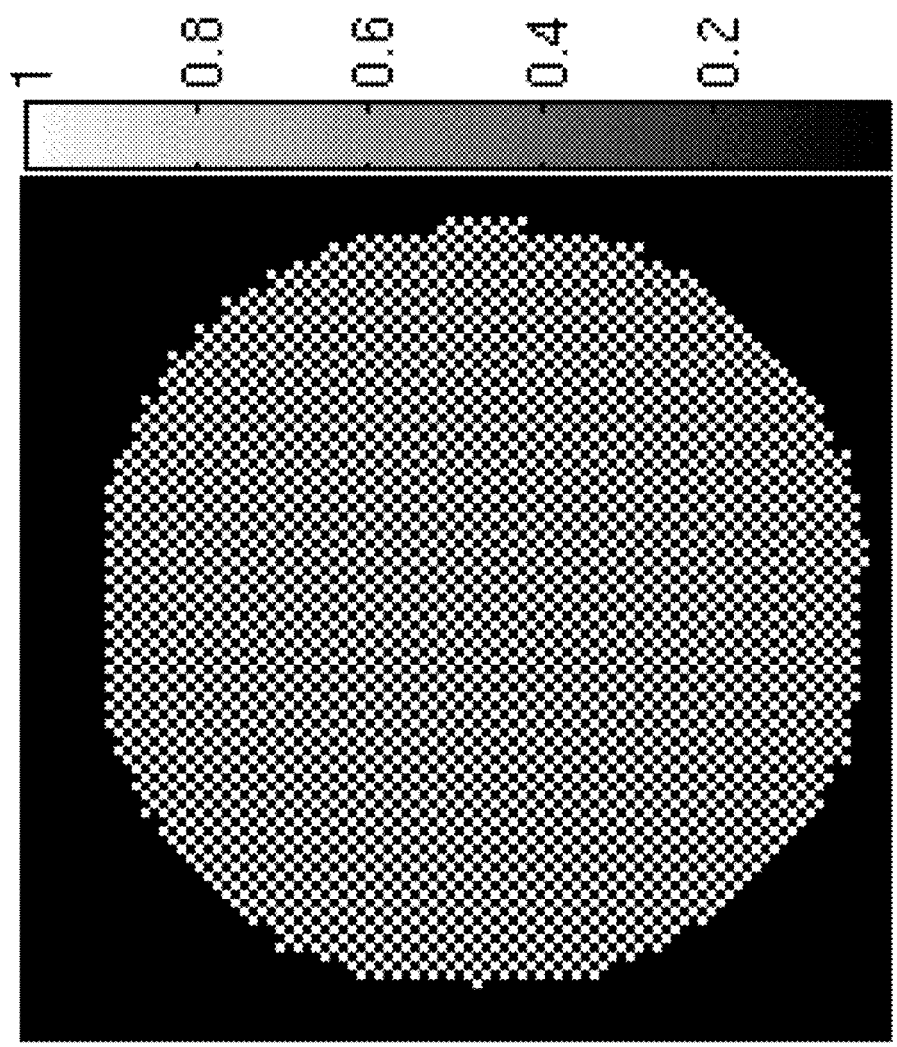
FIG. 10 the target distribution of the x-component of the magnetization for evaluation of the resolution of the inventive method compared with the prior art. On the spatial extent of 6 cm×6 cm, points with alternating target magnetization are positioned at distances of 6/92 cm in each direction. White areas correspond to a required pure x-magnetization, while black areas represent a required pure z-magnetization.
Figure 11:
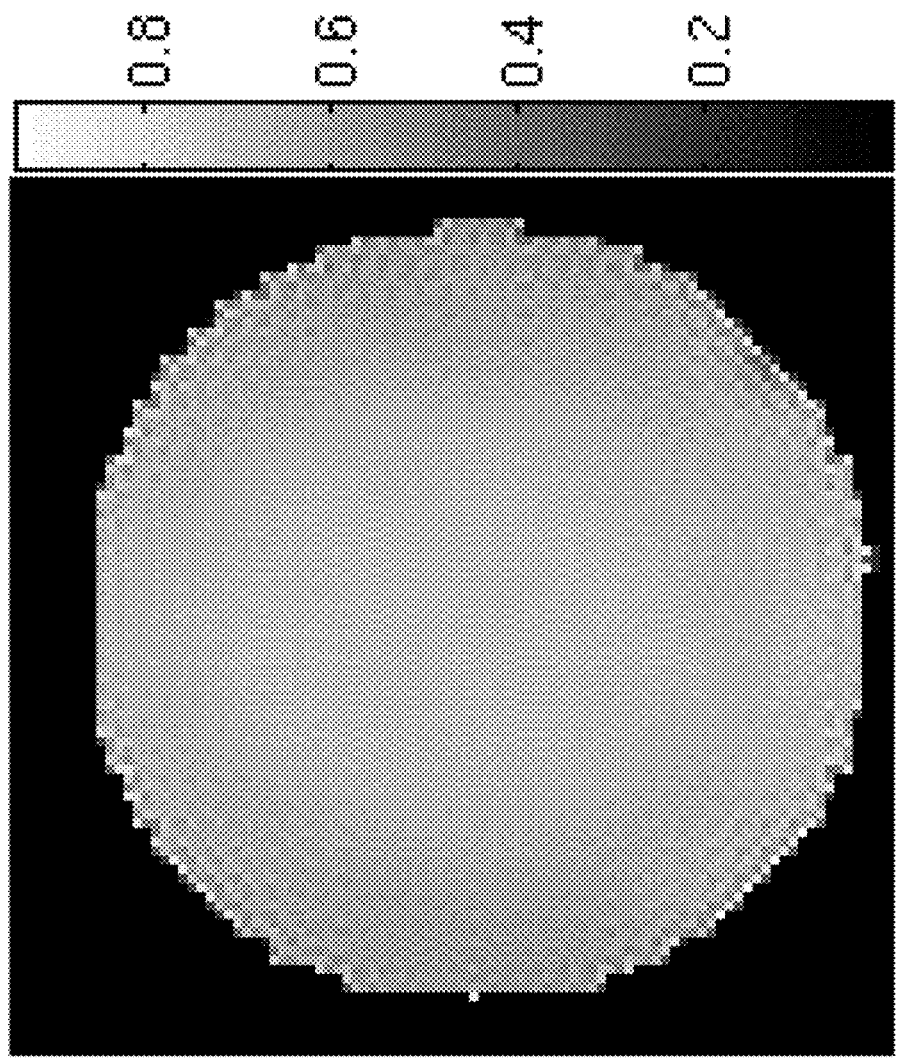
FIG. 11 the result of simulation of the changed position dependent magnetization by an RF pulse according to prior art with eight transmission antennas and using conventional supplementary magnetic fields with constant gradients, whose progression has been chosen such that the resolution of the target distribution in FIG. 10 is not possible. This can be seen by the spatially relatively homogeneous magnetization.
Figure 12:
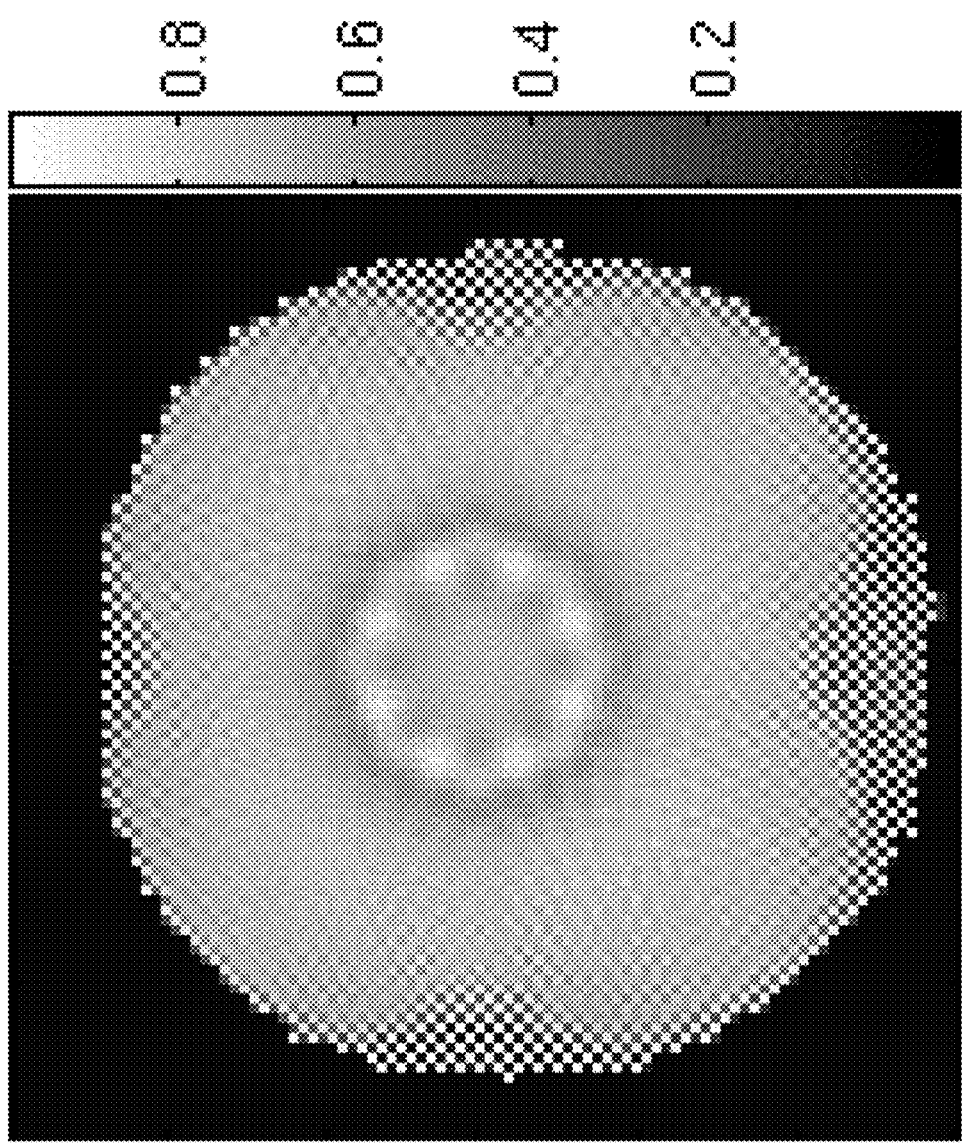
FIG. 12 the result of simulation of the changed position dependent magnetization by an RF pulse according to the inventive method using the supplementary magnetic fields shown in FIG. 2, whose maximum amplitude in the object matches the maximum amplitude of the conventional supplementary magnetic fields from the method according to prior art. It can be seen that, unlike FIG. 11, the target magnetization can be achieved in the outer regions of the two-dimensional object and that the resolution varies spatially. The supplementary magnetic fields are used such that the change in the magnetization is performed with spatially varying spatial resolution.

The characteristic of a non-constant gradient of the supplementary magnetic fields can also be advantageously used to effect the change in the magnetization, according to an dependent claim, with spatially varying resolution, as is illustrated in FIGS. 10 to 12. The change in the magnetization is initially effected according to the inventive method as shown in the above example, with the difference that the position dependent target magnetization is replaced by the pattern shown in FIG. 10. The result of simulation of position dependent magnetization modified in this way is shown in FIG. 12. By comparison with this, FIG. 11 shows magnetization modified according to the prior art using linear supplementary magnetic fields, whose maximum amplitude in the object matches that from the inventive method. It can be seen that the spatial resolution in FIG. 12 varies in space and that the inventive method can implement the magnetization in the edge regions of the mapping area according to the resolution of the target magnetization, whereas the method according to prior art is unable to achieve this at any point.

| List of reference symbols | |
|---|---|
| A | Array element |
| AX, AY, AZ, A1, A2 | Gradient amplifiers |
| COMP | Computer system |
| DSK | Storage unit |
| F1, F2 | Non-linear supplementary magnetic fields |
| GX, GY, GZ, G1, G2 | Gradient coils |
| $G_x, G_y, G_z$ | Gradients |
| KB | Computer keyboard |
| M | Main magnet |
| MON | Monitor |
| O | Object under examination |
| PNTR | Pointing device |
| RA$_{1...m}$ | RF reception antennas |
| RX$_{1...m}$ | Reception units |
| SEQ | Sequence control unit |
| TA$_{1...n}$ | RF transmission antennas |
| TX$_{1...n}$ | RF power transmitter |
| V | Examination volume |

We claim:

1. A method for position dependent change of magnetization in an object, according to a requirement, in a measurement performed in a magnetic resonance apparatus, the method comprising the steps of:
   a) applying a static and homogeneous basic field oriented along a z-direction;
   b) superposing non-linear supplementary magnetic fields, varying in space and over time, on the static and homogeneous basic field, wherein dependences over time of field strengths of the supplementary magnetic fields in a region of the object are calculated and/or measured in a position dependent manner;

c) calculating radio-frequency pulses using the time and position dependences of the supplementary magnetic fields determined in step b); and d) irradiating the radio-frequency pulses calculated in step c) in conjunction with the supplementary magnetic fields of step b), wherein the supplementary magnetic fields have a z-component spatial gradient which is not constant during at least at one instant of the irradiation.

2. The method of claim 1, wherein, if at least one group of equivalent positions occurs within the object during irradiation with a single radio-frequency transmission antenna whose transmission profile covers an entire object such that changes in the magnetization at the equivalent positions cannot be performed mutually independently, at least two transmission antennas are used having different spatial transmission profiles, wherein a change in the magnetization at at least one of the equivalent positions can be performed independently of a change in magnetization at other positions of the group.

3. The method of claim 1, wherein said supplementary magnetic fields effect a change in the magnetization with spatially varying spatial resolution.

4. The method of claim 1, wherein a setting of a position dependent change in the magnetization is chosen such that the magnetization undergoes a selectively non-vanishing change in only one or more regions within the object.

5. The method of claim 4, wherein at least one region is chosen such that it is adapted to anatomical, morphological, or functional properties of the object under examination and/or to a mapping characteristic of the magnetic resonance apparatus.

6. The method of claim 4, wherein the regions are chosen such that MR signals originating from a totality of all regions can be uniquely spatially encoded with a gradient system used in data acquisition.

7. The method of claim 1, wherein a phase of transverse magnetization is changed according to a defined spatial distribution.

8. The method of claim 7, wherein, in the magnetic resonance measurement, a change in spatial distribution of transverse magnetization phases is performed repeatedly in at least two phase encoding periods according to a spatial encoding scheme, with data acquisition being performed after each of these phase encoding periods, wherein a totality of the data thereby acquired is reconstructed having been resolved spatially according to the spatial encoding scheme and stored and/or displayed as an image.

* * * * *